(12) United States Patent
Kobayashi et al.

(10) Patent No.: US 7,550,811 B2
(45) Date of Patent: Jun. 23, 2009

(54) IMAGE PICKUP DEVICE AND METHOD OF MANUFACTURING THE SAME

(75) Inventors: Hiroya Kobayashi, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 533 days.

(21) Appl. No.: 10/530,754

(22) PCT Filed: Oct. 8, 2003

(86) PCT No.: PCT/JP03/12911

§ 371 (c)(1),
(2), (4) Date: Feb. 3, 2006

(87) PCT Pub. No.: WO2004/034471

PCT Pub. Date: Apr. 22, 2004

(65) Prior Publication Data

US 2006/0240586 A1    Oct. 26, 2006

(30) Foreign Application Priority Data

Oct. 9, 2002    (JP) .............................. 2002-296543

(51) Int. Cl.
*H01L 21/00*    (2006.01)
(52) U.S. Cl. ................ 257/431; 257/432; 257/E31.127
(58) Field of Classification Search ................ 257/432, 257/433, 434, 447, E31.127, E31.128, E31.131, 257/291, 747, 706, 713, 719, 717, 705, 460
See application file for complete search history.

(56) References Cited

U.S. PATENT DOCUMENTS 4,760,031 A    7/1988    Janesick .................... 437/3

FOREIGN PATENT DOCUMENTS

JP    62-189883    8/1987

(Continued)

OTHER PUBLICATIONS

Sol M. Gruner et al., "Charge-Coupled Device Area X-ray Detectors", Review of Scientific Instruments, American Institute of Physics, US, vol. 73, No. 8, Aug. 2002, pp. 2815-2842.

(Continued)

*Primary Examiner*—Evan Pert
*Assistant Examiner*—Selim Ahmed
(74) *Attorney, Agent, or Firm*—Drinker Biddle & Reath LLP

(57) ABSTRACT

The present invention relates to an image pickup device, etc., having a structure such that electrostatic discharge is unlikely to occur when an FOP and a CCD reading part are joined. This image pickup device comprises a semiconductor substrate, provided with the CCD reading part on a front surface that opposes a back surface, which serves as a light-incident surface, a package having a cavity in which the semiconductor substrate is fixed, a cover covering an upper opening of the cavity, an FOP joined to the semiconductor substrate, and electrical wirings. The cover has a guiding opening for inserting the FOP into the cavity, and the semiconductor substrate is thinned at a portion corresponding to a region at which the CCD reading part is disposed. Also, the semiconductor substrate is fixed to a bottom surface of the cavity such that the CCD reading part and the bottom surface face each other, and a light outgoing end surface of the FOP is optically coupled to the thin part of the semiconductor substrate in the state of being inserted into the cavity from the guiding opening.

2 Claims, 12 Drawing Sheets

FOREIGN PATENT DOCUMENTS

| | | |
|---|---|---|
| JP | 06-196680 | 7/1994 |
| JP | 06196680 A * | 7/1994 |
| JP | 09-199699 | 7/1997 |
| JP | 11-188033 | 7/1999 |
| JP | 11188033 A * | 7/1999 |
| JP | 2000-028735 | 1/2000 |
| JP | 2000-324400 | 11/2000 |
| JP | 2002-033467 | 1/2002 |

OTHER PUBLICATIONS

A.R. Faruqi et al., "A High Sensitivity Imaging Detector For Electron Microscopy", Nuclear Instruments & Methods in Physics Research A 367 (1995), pp. 408-412.

A.R. Faruqi et al., "Digital Detectors For Electron Microscopy", Nuclear Instruments & Methods in Physics Research A 478 (2002), pp. 88-97.

* cited by examiner

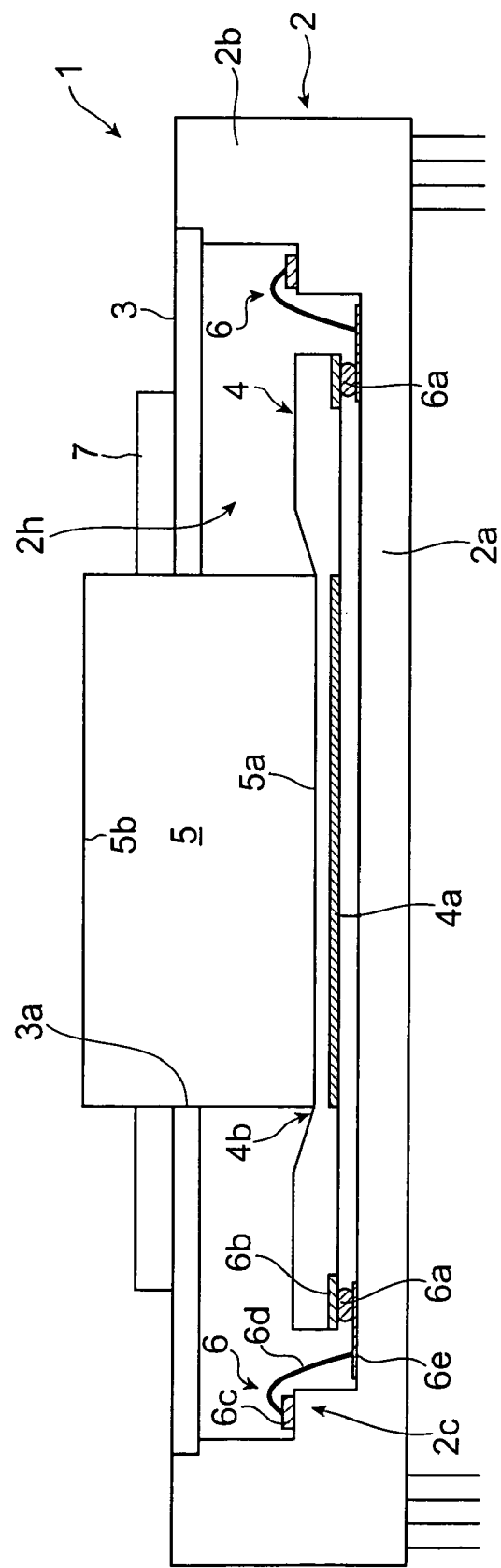

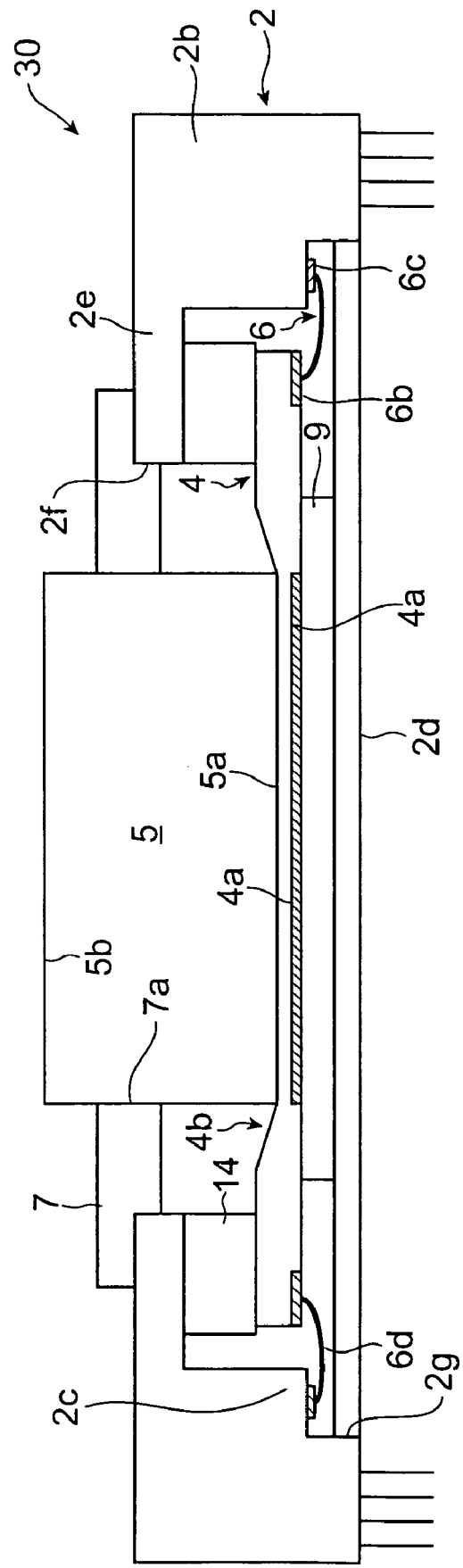

IMAGE PICKUP DEVICE AND METHOD OF MANUFACTURING THE SAME

TECHNICAL FIELD

The present invention relates to an image pickup device, incorporating a CCD reading part, and a method of manufacturing such an image pickup device.

BACKGROUND ART

With a transmission electron microscope, etc., an image pickup device, incorporating a charge reading part (referred to hereinafter as "CCD reading part") that comprises a charge coupled device, is applied as a means of observing and recording electron beam images. Since a CCD reading part can record images as electronic information, image pickup devices, incorporating such CCD reading parts, have become widely popular in recent years.

As an example of such a conventional image pickup device, the image pickup device described in Japanese Patent Application Laid-Open No. 2000-324400 is known. As shown in FIG. 1, this image pickup device is equipped with a scintillator 107, a semiconductor substrate 109, a fiber optic plate 108 (referred to hereinafter as "FOP"), a CCD reading part control part 110, a computer 111, etc. The scintillator 107 emits light when illuminated by an electron beam. The semiconductor substrate 109 is positioned below scintillator 107 and has a CCD reading part for picking up a two-dimensional optical image. The FOP 108 is positioned between scintillator 107 and semiconductor substrate 109 and is optically coupled to semiconductor substrate 109 in order to carry an optical image to semiconductor substrate 109. The CCD reading part control part 110 controls a CCD reading part. The computer 111 converts image pickup data, taken in by the CCD reading part, into an image and displays the image resulting from conversion.

In FIG. 1, 101 is an electron gun, 102 is an irradiation lens system, 103 is a sample, 104 and 105 indicate an objective lens system, 106 is a fluorescent plate, 112 is an electron beam shielding plate, 115a and 115b are electron beam shielding means, and 200 is an electron beam image pickup device, arranged from FOP 108 and semiconductor substrate 109.

DISCLOSURE OF THE INVENTION

As a result of studying the above-described prior art, the present inventors discovered the following issues. That is, with the conventional image pickup device described in Japanese Patent Application Laid-Open No. 2000-324400, a light outgoing end surface of FOP 108 is optically coupled with semiconductor substrate 109 by an adhesive, etc., which is transparent to the light emitted by scintillator 107. However, the yield of the process of joining FOP 108 and semiconductor substrate 109 could not be improved above a certain level.

As a result of conducting diligent study towards improving this yield further, the inventors found that electrostatic discharge of the CCD reading part occurs in the step of joining FOP 108 and semiconductor substrate 109. That is, FOP 108, which is an insulating material, becomes charged with static electricity in the process of handling, and at the instant at which FOP 108 and semiconductor substrate 109 is joined, an excess current flows from FOP 108 to the CCD reading part, causing the CCD reading part to undergo electrostatic discharge.

This invention has been made to resolve the above issue, and an object thereof is to provide an image pickup device, having a structure, with which electrostatic discharge is unlikely to occur during the joining of an FOP and a CCD reading part, and a method of manufacturing such an image pickup device.

The image pickup device according to the present invention comprises a semiconductor substrate having a charge reading part (CCD reading part) constituted by a charge coupled device that detects incident light, and a fiber optic plate (FOP) having a light outgoing end surface to be optically coupled to the semiconductor substrate. The semiconductor substrate has a back surface, serving as a light-incident surface, and a front surface, opposing the back surface and being provided with the CCD reading part that detects light propagating from the back surface. The light outgoing end surface of the FOP is joined to the back surface of the semiconductor substrate. Thus, the light emitted from the FOP is transmitted through the semiconductor substrate from the back surface and thereafter reaches the CCD reading part disposed at the front surface.

In the image pickup device according to the present invention, since the FOP and the CCD reading part do not contact each other directly as described above, excess current from the FOP will not flow directly to the CCD reading part during the joining of the FOP to the semiconductor substrate and electrostatic discharge of the CCD reading part is thus restrained effectively.

The light outgoing end surface of the FOP is joined to a part of the back surface of the semiconductor substrate that corresponds to a region of the front surface at which the CCD reading part is disposed. In this case, since the light outgoing end surface of the FOP overlaps the region at which the CCD reading part is formed while the semiconductor substrate is sandwiched in between, an optical image emitted from the FOP can be picked up without omission by the CCD reading part.

The semiconductor substrate has a structure such that a recess is formed at a portion of the back surface corresponding to the region at which the CCD reading part is disposed and the thickness of the region at which the CCD reading part is disposed is thinner than the remaining region. By a part of the FOP being fitted in this thin part, the back surface of the semiconductor substrate and the light outgoing end surface of the FOP are joined. By this arrangement, the thickness of the semiconductor substrate, through which the light emitted from the FOP is transmitted until it is detected by the CCD reading part, is made thin and light of shorter wavelength can be detected at high sensitivity. Also, by forming the thin part, positioning in the process of joining the FOP to the semiconductor substrate is facilitated.

To the front surface of the semiconductor substrate, a protective plate is preferably joined so as to cover the entirety of the CCD reading part. By this arrangement, the CCD reading part is protected from contamination, etc., and the semiconductor substrate is reinforced mechanically.

The image pickup device according to the present invention may comprise a semiconductor substrate, a package, an FOP, a cover, and electrical wirings.

The semiconductor substrate has a back surface, serving as a light-incident surface, and a front surface, opposing the back surface and being provided with a CCD reading part constituted by a charge coupled device that detects light arriving from the back surface. This semiconductor substrate has a structure such that a recess is formed at a portion of the back surface corresponding to a region at which the CCD reading part is disposed and the thickness of the region at which the CCD reading part is disposed is thinner than the remaining region. The package has a cavity that houses the semiconductor substrate and that is fixed with the semiconductor substrate while the front surface of the semiconductor substrate faces a bottom part of the cavity. The FOP is housed at least in part in the cavity of the package and a light outgoing end surface thereof is joined to the back surface of the semiconductor substrate. The cover covers an upper opening of the cavity of the package. Also, this cover has a guiding opening for insertion of at least a part of the FOP into the cavity. The electrical wirings take out charge signals output from the CCD reading part to the exterior of the package. In particular, these electrical wirings include at least substrate electrodes, package-side wirings, and package-side electrodes. The substrate-side electrodes are disposed on the front surface of the semiconductor substrate. The package-side wirings are disposed on the cavity bottom surface and are electrically connected via bumps to the substrate-side electrodes. The package-side electrodes are disposed on an inner wall of the cavity and are electrically connected via bonding wires to the package-side wirings.

As described above, in the image pickup device according to the present invention, since the light outgoing end surface of the FOP and the CCD reading part do not contact each other directly and an excess current therefore does not flow to the CCD reading part in the process of joining the FOP to the semiconductor substrate, electrostatic discharge of the CCD reading part is restrained effectively.

Since a part of the FOP is fitted into the thin part (recess) formed in the back surface of the semiconductor substrate, the distance between the light outgoing end surface of the FOP and the CCD reading part is shortened and light of shorter wavelength can be detected at high sensitivity. Also, by the forming of the thin part, positioning in the process of joining the FOP to the semiconductor substrate is facilitated. In addition, since the electrical wirings for taking out the charge signals of the CCD reading part to the exterior can be shortened, the wiring capacity is made small and attenuation of the signal waveform will not occur.

Furthermore, the image pickup device according to the present invention may comprise a semiconductor substrate, a package, an FOP, and electrical wirings.

The semiconductor substrate has a back surface, serving as a light-incident surface, and a front surface, opposing the back surface and being provided with a CCD reading part constituted by a charge coupled device that detects light propagating from the back surface. This semiconductor substrate has a structure such that a recess is formed at a part of the back surface corresponding to a region at which the CCD reading part is disposed and the thickness of the region at which the CCD reading part is disposed is thinner than the remaining region. The package has a cavity which houses the semiconductor substrate, the cavity having one surface whose opening portion is covered by a bottom cover, and the other surface opposing the one surface and whose opening portion is attached with a guide member having a guiding opening. The semiconductor substrate is fixed to the package such that the CCD reading part and the bottom cover face each other while the semiconductor substrate is housed. At least a part of the FOP is housed inside the cavity of the package through the guiding opening. A light outgoing end surface of this FOP is joined to the region of the back surface of the semiconductor substrate that is thin in thickness. The electrical wirings take out charge signals output from the CCD reading part to the exterior of the package. In particular, these electrical wirings include at least substrate-side electrodes and package-side electrodes. The substrate-side electrodes are disposed on the front surface of the semiconductor substrate. The package-side electrodes are disposed on an inner wall of the package and are electrically connected via bonding wires to the substrate-side electrodes.

As described above, since a part of the FOP is fitted into the thin part (recess) formed in the back surface of the semiconductor substrate, the distance between the light outgoing end surface of the FOP and the CCD reading part is shortened and light of shorter wavelength can be detected at high sensitivity. Also, by the forming of the thin part in the back surface of the semiconductor substrate, positioning in the process of joining the FOP to the semiconductor substrate is facilitated. Also, a guiding opening is provided in the guide member that is mounted to the other opening portion of the package, and this guiding opening functions as a reference member in the process of inserting at least a part of the FOP inside the cavity and facilitates positioning in the process of joining the FOP to the semiconductor substrate.

Since the wiring structure enables the electrical wirings for taking out the charge signals of the CCD reading part to the exterior of the package to be shortened, the wiring capacity is made small and attenuation of the signal waveform will not occur.

In an image pickup device manufacturing method according to the present invention, a semiconductor substrate and an FOP are prepared, and a light outgoing end surface of the FOP is joined to a back surface of the semiconductor substrate.

As described above, the semiconductor substrate has a back surface, serving as a light-incident surface, and a front surface, opposing the back surface and being provided with a CCD reading part constituted by a charge coupled device that detects light propagating from the back surface.

Thus, in the image pickup device manufacturing method according to the present invention, the CCD reading part and the light outgoing end surface of the FOP do not contact each other directly in the step of joining the FOP and the semiconductor substrate, thereby preventing the flowing of excess current from the FOP to the CCD reading part. Electrostatic discharge of the CCD reading part is thus restrained and the manufacturing yield of the image pickup device is thus improved.

The respective embodiments of this invention shall become adequately clear by the detailed description that follows and the attached drawings. These embodiments are indicated simply as examples and should not be considered as limiting this invention.

A further scope of application of this invention shall become clear from the detailed description that follows. However, though this detailed description and specific examples illustrate preferred modes of this invention, these are simply indicated as examples and it is clear that various modifications and improvements within the main point and scope of this invention will be made obvious by this detailed description to those skilled in the art.

BRIEF DESCRIPTION OF THE DRAWINGS

FIG. 2 is a diagram showing the cross-sectional structure of a first embodiment of an image pickup device according to the present invention;

FIG. 9 is a diagram showing the cross-sectional structure of a third embodiment of an image pickup device according to the present invention;

BEST MODES FOR CARRYING OUT THE INVENTION

Figure 1:
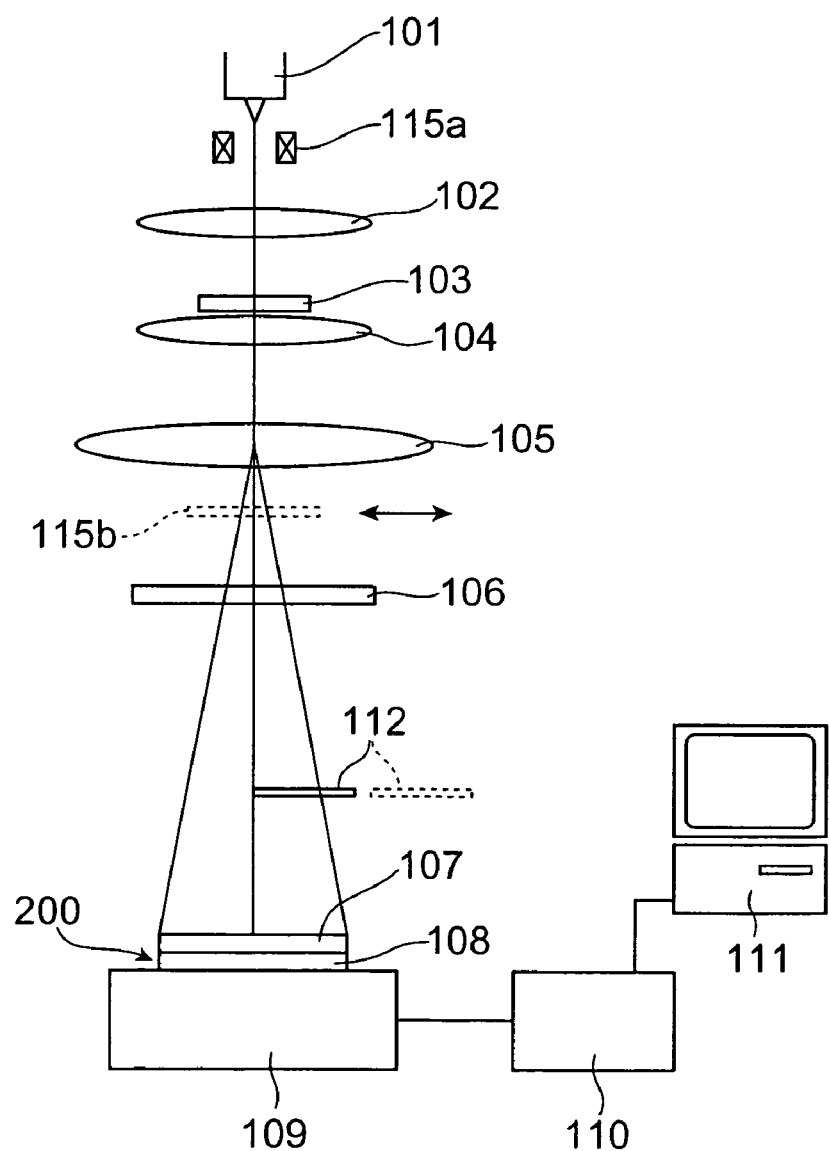
FIG. 1 is a diagram showing the structure of a transmission electron microscope that includes a conventional image pickup device.

Embodiments of an image pickup device and an image pickup device manufacturing method according to the present invention shall now be described in detail using FIGS. 2, 3A to 4C, 5, 6A to 8B, 9, 10A to 11D and 12. In the description of the drawings, the same symbols shall be attached to portions and elements that are the same and redundant description shall be omitted.

First Embodiment

FIG. 2 is a diagram showing the cross-sectional structure of a first embodiment of an image pickup device according to the present invention. In image pickup device 1 of this first embodiment, a semiconductor substrate 4, having a CCD reading part 4a, is housed inside a cavity 2h of a package 2, and the semiconductor substrate 4 is optically coupled to an FOP 5.

The image pickup device 1 comprises a package 2, having the cavity 2h surrounded by a bottom surface part 2a and the side wall parts 2b, a cover 3 covering an opening of package 2, the semiconductor substrate 4 comprised of silicon, etc. and having CCD reading part 4a formed on a front surface side, FOP 5 joined to the semiconductor substrate 4, and electrical wirings 6 for taking out charge signals output from the CCD reading part 4a to the exterior of the package 2.

The cover 3 is formed with a guiding opening 3a for insertion of at least a part of the FOP 5 into the cavity 2h.

The semiconductor substrate 4 has a thin part 4b formed therein by the thinning of a back surface region corresponding to a front surface region at which the CCD reading part 4a is disposed. Also, this semiconductor substrate 4 is fixed via bumps 6a to the bottom surface part 2a such that the CCD reading part 4a and the bottom surface part 2a face each other.

The FOP 5 is inserted into the cavity 2h from the guiding opening 3a, and by a portion thereof being fitted onto the thin part 4b, a light outgoing end surface 5a of the FOP 5 becomes optically coupled to the thin part 4b.

The electrical wirings 6 include substrate-side electrodes 6b disposed on the front surface of the semiconductor substrate 4, package-side wirings 6e disposed on the bottom surface part 2a, and package-side electrodes 6c disposed on steps 2c of the side wall parts 2b.

Here, the substrate-side electrodes 6b and the package-side wirings 6e are electrically connected via bumps 6a disposed on the substrate-side electrodes 6b by flip-chip bonding, and the package-side wirings 6e and the package-side electrodes 6c are electrically connected via bonding wires 6d (wire bonding).

Here, a guide member 7, which functions as a reference member in the process of inserting the FOP 5 into the cavity 2h, is positioned on the cover 3 so as to surround the guiding opening 3a. The principal parts of this image pickup device 1 correspond to electron image pickup device 200 of the transmission electron microscope shown in FIG. 1, and the light-incident end surface 5b of the FOP 5 is optically coupled to a scintillator, etc.

Here, the package 2 and the cover 3 are preferably formed of ceramic or other insulating material. Also, the light outgoing end surface 5a of the FOP 5 and the thin part 4b of the semiconductor substrate 4 are preferably optically coupled by a room temperature curing type adhesive (silicone resin), etc., which is transparent to the emission wavelength of the scintillator. Also, the thickness of the thin part 4b is preferably approximately 10 μm to 30 μm for increasing the sensitivity to light of short wavelength.

The CCD reading part 4a preferably has the same planar shape as the light outgoing end surface 5a of the FOP 5 such that an optical image having propagated through the FOP 5 can be detected without omission. The light outgoing end surface 5a of the FOP 5 has a shape that is accurately fitted onto the thin part 4b, and at the back surface of the semiconductor substrate 4, the light outgoing end surface 5a is joined to the portion corresponding to the region at which the CCD reading part 4a is formed.

Furthermore, since the guiding opening 3a is an entrance for inserting a part of the FOP 5 into the cavity 2h, it has a size that is at least equal to or greater than the size of the light outgoing end surface 5a. Also, since the guide member 7, which is positioned the periphery of the guiding opening 3a, is a member that defines the direction of insertion of the part of the FOP 5 into the cavity 2h and guides the light outgoing end surface 5a of the FOP 5 to the thin part 4b, the dimensional precision of the wall surfaces thereof is preferably no less than a predetermined value. For example, the light outgoing end surface 5a of the FOP 5 has a size of 35.7 mm×8.7 mm and the guiding opening 3a has an opening size of 35.9 mm×8.9 mm.

As described above, the image pickup device 1 of this first embodiment has a structure such that the FOP 5 and the CCD reading part 4a do not contact each other directly, and thus even when excess current flows from the FOP 5 to the semiconductor substrate 4 in the process of joining the FOP 5 to the semiconductor substrate 4, electrostatic discharge of the CCD reading part 4a is restrained.

Also, since the thickness of the thin part 4b, to which the FOP 5 is joined, is only approximately 10 μm to 30 μm, the CCD reading part 4a can detect even light of short wavelength emitted from the light outgoing end surface 5a. By forming the thin part 4b such that the light outgoing end surface 5a of the FOP 5 can be fitted in a gap-less manner, positioning in the process of joining the FOP 5 to the semiconductor substrate 4 is facilitated.

Since the guide member 7 functions as a reference member in the insertion of at least a part of the FOP 5 into the cavity 2h, the FOP 5 can be inserted accurately onto the thin part 4b of the semiconductor substrate 4. Also, since the electrical wirings 6 for taking out charge signals of the CCD reading part 4a to the exterior are shortened, the electrical wirings 6 are made small in wiring capacity and the waveforms of signals from the CCD reading part 4a will not become attenuated.

The operations in a case where, for example, the image pickup device 1 of the first embodiment is applied to the picking up of a transmitted electron beam image of a transmission electron microscope (see FIG. 1) shall now be described.

An electron beam is first made incident on the scintillator disposed at the light-incident end surface 5b side of the FOP 5. The light emitted from the scintillator then propagates through the FOP 5 from the light-incident end surface 5b to the light outgoing end surface 5a.

The light that is emitted from the light outgoing end surface 5a of the FOP 5 passes through the thin part 4b from the back surface (surface on which the CCD reading part 4a is not formed) and reaches the CCD reading part 4a, disposed at the front surface side of the semiconductor substrate 4. The light that arrives at the CCD reading part 4a is photoelectrically converted and accumulated as charges in CCD reading part 4a. The accumulated charges are successively read based on the CCD control signals. The charge signals read from the CCD reading part 4a are converted into an image by a computer, etc.

A method of manufacturing image pickup device 1 shall now be described using FIGS. 3A to 3D and 4A to 4C.

Figure 3A:
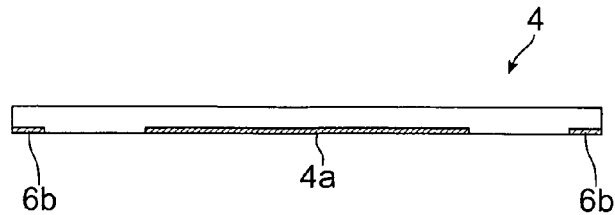
FIGS. 3A to 3D are process diagrams for explaining a method of manufacturing the image pickup device according to the first embodiment (part 1)
Figure 3B:
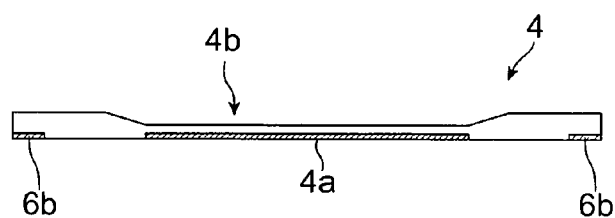

First, in the semiconductor substrate 4 on which the CCD reading part 4a has been formed (FIG. 3A), the thin part 4b is formed at the back surface of the region at which the CCD reading part 4a has been formed (FIG. 3B). In particular, the peripheral region is protected by a photoresist, etc., in a manner such that the portion that is to become the thin part 4b will be exposed, and by anisotropic etching, etc., the semiconductor substrate 4 is thinned from the back surface until the thickness of the thin part 4b becomes a predetermined thickness (10 μm to 30 μμm).

Figure 3C:
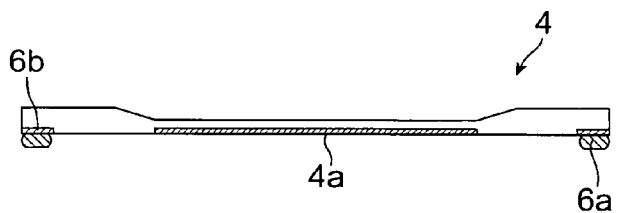
Figure 3D:
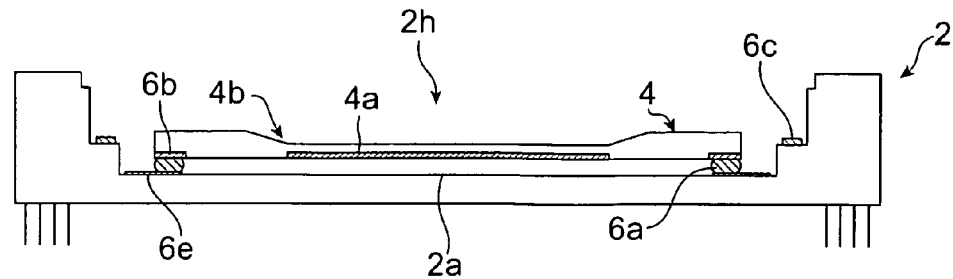

The bumps 6a, formed of Au, are then formed on the substrate-side electrodes 6b of the semiconductor substrate 4 (FIG. 3C). The semiconductor substrate 4 is then set inside the ceramic package 2 such that the CCD reading part 4a and the bottom surface part 2a face each other, and by flip-chip bonding of the bumps 6a and the package-side wirings 6e, the semiconductor substrate 4 is fixed to the package 2 (FIG. 3D).

Figure 4A:
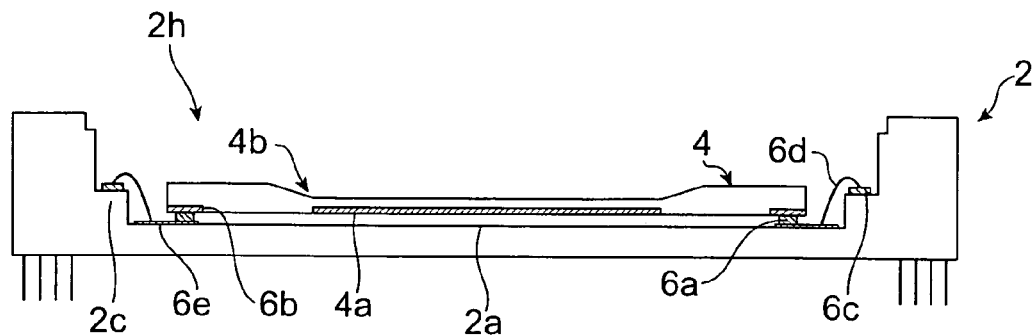
FIGS. 4A to 4C are process diagrams for explaining the method of manufacturing the image pickup device according to the first embodiment (part 2)
Figure 4B:
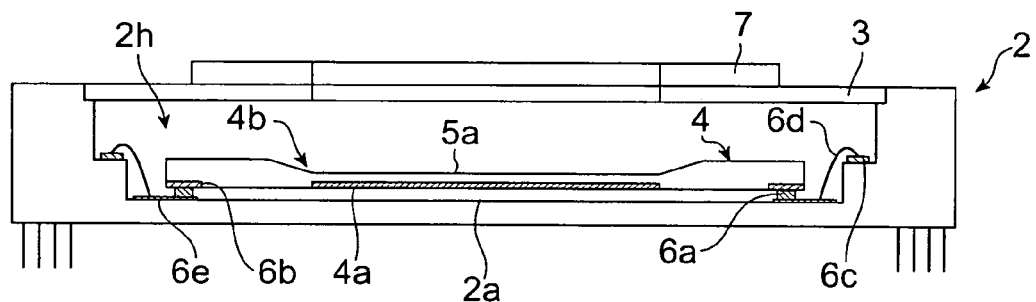

The package-side wirings 6e and the package-side electrodes 6c disposed on the steps 2c of the side walls 2b, are electrically connected by bonding wires 6d (FIG. 4A). Thereafter, the cover 3, having a guide member 7 mounted at a predetermined position, is mounted onto the package 2 (FIG. 4B).

Figure 4C:
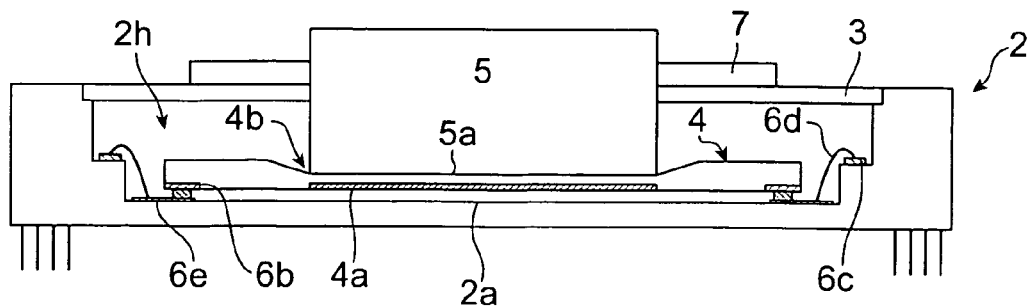

The FOP 5 is inserted along the guide member 7 and into the interior of the package 2 through the guiding opening 3a formed in the cover 3. In this process, the outgoing end surface 5a of the FOP 5 is optically coupled to the thin part 4b (FIG. 4C). Last, the gap between the FOP 5 and the guiding opening 3a is sealed by a resin, and thereby the image pickup device 1 of the first embodiment is obtained.

As described above, in accordance with the method of manufacturing image pickup device 1 of the first embodiment, since in the step (FIG. 4C) of joining the FOP 5 to the semiconductor substrate 4, the light outgoing end surface 5a of the FOP 5 and the CCD reading part 4a do not contact each other directly, excess current will not flow from the FOP 5 to the CCD reading part 4a even when the FOP 5 is charged. Electrostatic discharge of the CCD reading part 4a is thus restrained and the manufacturing yield of the image pickup device 1 is improved.

Second Embodiment

Figure 5:
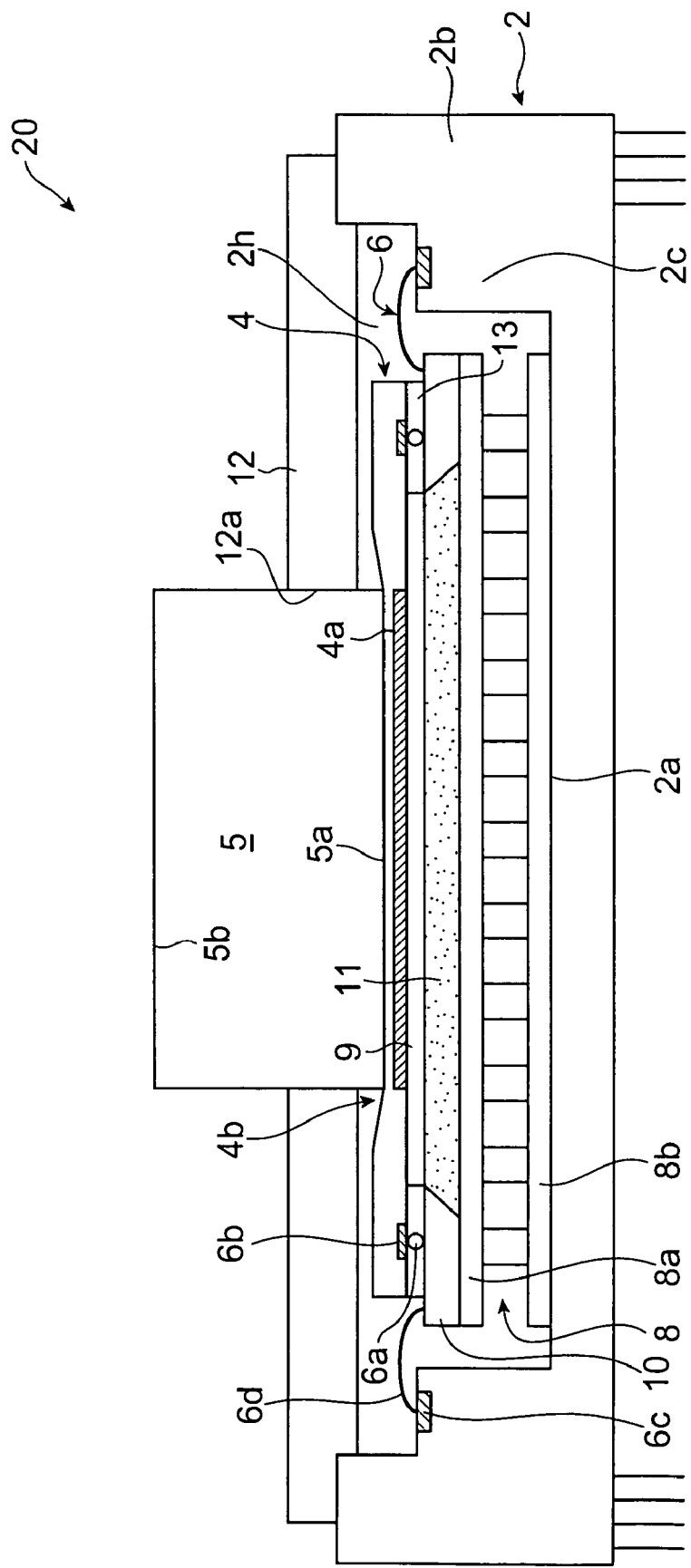
FIG. 5 is a diagram showing the cross-sectional structure of a second embodiment of an image pickup device according to the present invention.

The arrangement of a second embodiment of an image pickup device according to the present invention shall now be described using FIG. 5. Though the image pickup device 20 of this second embodiment has substantially the same structure as the above-described first embodiment, it differs in that a Peltier element 8, for cooling a CCD reading part 4a, is housed inside a cavity 2h of a package 2, a protective plate 9 is adhered onto a front surface (surface on which the CCD reading part 4a is formed) of a semiconductor substrate 4, a guide member 12 serves in common as the first embodiment's cover 3 (FIG. 2), etc. The principal parts of the image-pickup device 20 according to this second embodiment also correspond to the electron beam image pickup device 200 shown in FIG. 1 and can be applied to the transmission electron microscope of FIG. 1, etc.

The image pickup device 20 comprises the package 2, the Peltier element 8, the semiconductor substrate 4, the protective plate 9, the bumps 6a, an auxiliary substrate 10, a resin 11, and the electrical wirings 6.

The package 2 has the cavity 2h, surrounded by a bottom surface part 2a and side wall parts 2b. The Peltier element 8 is fixed to the bottom surface 2a in a state in which the bottom surface part 2a contacts a heat generating surface 8b. The semiconductor substrate 4 is positioned such that the front surface, on which the CCD reading part 4a is formed, faces a cooling surface 8a of the Peltier element 8. The protective plate 9 is adhered onto the front surface of the semiconductor substrate 4 so as to cover the region at which the CCD reading part 4a is formed. The bumps 6a are disposed at a peripheral part of the front surface. The auxiliary substrate 10 is a substrate, which is connected to the bumps 6a and is interposed between the bumps 6a and the cooling surface 8a, and is adhered to the vicinity of end part of cooling surface 8a. The resin 11 fills the space between the protective plate 9 and the cooling surface 8a. The electrical wirings 6 take out charge signals, output from the CCD reading part 4a, to the exterior of the package 2.

Of the back surface of the semiconductor substrate 4, a portion, corresponding to the front surface region at which the CCD reading part 4a is formed, is thinned (thin part 4b). Also, a part of the FOP 5 is inserted into the cavity 2h from a guiding opening 12a of the guide member 12, which is the cover of the package 2, and the light outgoing end surface 5a of the FOP 5 is optically coupled to the thin part 4b.

The charge signals from the CCD reading part 4a are read via the substrate-side electrodes 6b, the bumps 6a, an electrical circuit formed on auxiliary substrate 10, and the bonding wires 6d, connecting the auxiliary substrate 10 to the package-side electrodes 6c, which are disposed on the steps 2c of the side wall parts 2b. Also, the gap between the auxiliary substrate 10 and the semiconductor substrate 4 is filled with a bump protection resin 13.

Here, the package 2 is preferably formed of ceramic or other insulating material. Also, the light outgoing end surface 5a of the FOP 5 and the thin part 4b of the semiconductor substrate 4 are preferably optically coupled by a room temperature curing type adhesive (silicone resin), etc., which is transparent to the emission wavelength of the scintillator.

The thickness of the thin part 4b is preferably approximately 10 μm to 30 μm for increasing the sensitivity to light of short wavelength.

The CCD reading part 4a preferably has the same shape as the light outgoing end surface 5a of the FOP 5 such that an optical image having propagated through the FOP 5 can be detected without omission. Also, the light outgoing end surface 5a of the FOP 5 preferably has a shape that is accurately fitted onto the thin part 4b.

Since the guiding opening 12a is a member that defines the direction of insertion of the FOP 5 into the interior of the package 2 and guides the light outgoing end surface 5a of the FOP 5 to the thin part 4b, the dimensional precision of the wall surfaces thereof is preferably no less than a predetermined value.

Also, the auxiliary substrate 10 is not restricted in particular in terms of material as long as it can support semiconductor substrate 4. As the material of auxiliary substrate 10, a comparatively hard material, such as silicon, glass, plastic, etc., is suited. Since the auxiliary substrate 10 has a function of transmitting the charge signals from the CCD reading part 4a to the bonding wires 6d, suitable electrical wirings are preferably disposed on a surface of the auxiliary substrate 10.

As the resin 11, for example, an epoxy resin is preferable for promoting the heat exchange between the cooling surface 8a of the Peltier element 8 and the CCD reading part 4a. Also, for protection of the CCD reading part 4a from contamination, etc., and for mechanical reinforcement of the semiconductor substrate 4, the protective plate 9 is preferably formed, for example, of glass.

As described above, the image pickup device 20 of this second embodiment has a structure such that the FOP 5 and the CCD reading part 4a do not contact each other directly. Thus, even when excess current flows from the FOP 5 to the semiconductor substrate 4 in the process of joining the FOP 5 to the semiconductor substrate 4, electrostatic discharge of the CCD reading part 4a is restrained.

Also, since the thickness of the thin part 4b, to which the FOP 5 is joined, is only approximately 10 μm to 30 μm, the CCD reading part 4a can detect even light of short wavelength emitted from the light outgoing end surface 5a. By forming the thin part 4a such that the light outgoing end surface 5a of the FOP 5 can be fitted in a gap-less manner, positioning in the process of joining the FOP 5 to the semiconductor substrate 4 is facilitated.

Since the guide member 12 functions as a reference member in the insertion of at least a part of the FOP 5 into the cavity 2h, the FOP 5 can be joined accurately to the thin part 4b of the semiconductor substrate 4. Also, since the protective plate 9, formed of glass, etc., is put in contact with the front surface of the semiconductor substrate 4, at which the CCD reading part 4a is formed, the CCD reading part 4a is protected from contamination, etc., and the semiconductor substrate is reinforced mechanically.

Furthermore, since the CCD reading part 4a is cooled by the Peltier element 8, the S/N ratio of the CCD reading part 4a is improved. Also, since the electrical wirings 6 for taking out charge signals of the CCD reading part 4a to the exterior are shortened, the electrical wirings 6 are made small in wiring capacity and the waveforms of signals from the CCD reading part 4a will not become attenuated.

A method of manufacturing the image pickup device 20 of the second embodiment shall now be described using FIGS. 6A to 6D, 7A to 7D and 8A and 8B.

Figure 6A:
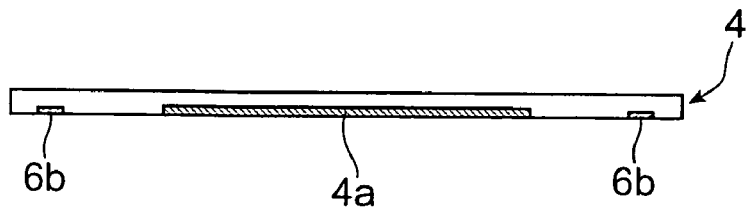
FIGS. 6A to 6D are process diagrams for explaining a method of manufacturing the image pickup device according to the second embodiment (part 1)
Figure 6B:
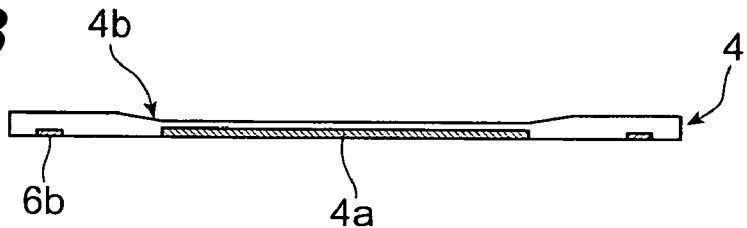
Figure 6C:
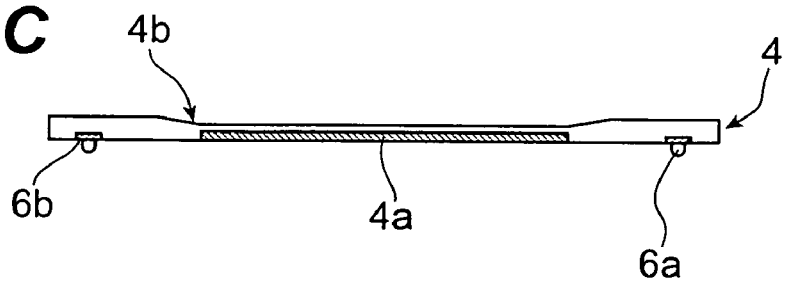

First, in the semiconductor substrate 4, of which the CCD reading part 4a has been formed at the front surface side (FIG. 6A), the thin part 4b is formed at the portion of the back surface corresponding to the region at which the CCD reading part 4a has been formed (FIG. 6B). The bumps 6a, formed of Au, are then formed on the substrate-side electrodes 6b of the semiconductor substrate 4 (FIG. 6C).

Figure 6D:
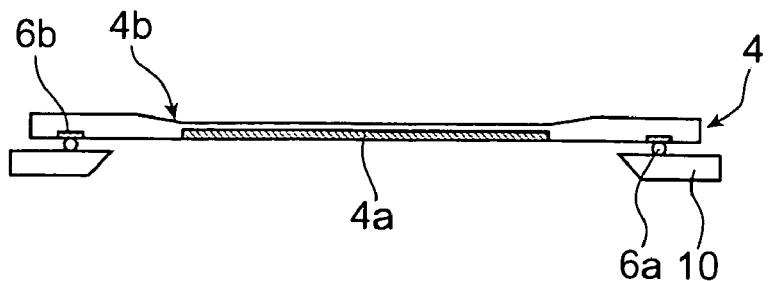
Figure 7A:
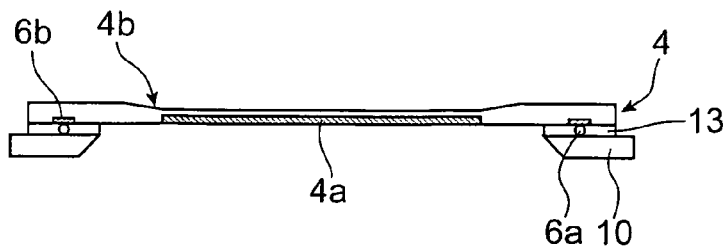
FIGS. 7A to 7D are process diagrams for explaining the method of manufacturing the image pickup device according to the second embodiment (part 2)

When the bumps 6a have been formed, the semiconductor substrate 4 and the auxiliary substrate 10 are flip-chip bonded (FIG. 6D). Thereafter, in order to protect the bumps 6a, the gap between the semiconductor substrate 4 and the auxiliary substrate 10 is filled with silicone resin or other bump protection resin 13 (FIG. 7A)

Figure 7B:
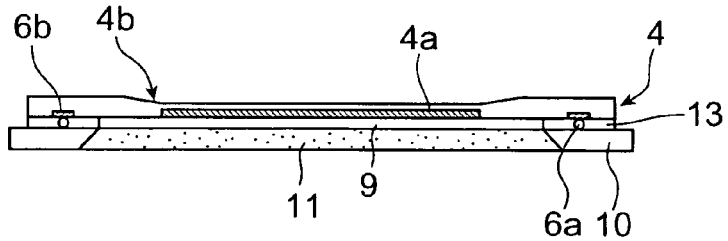

On the front surface of the semiconductor substrate 4, at which the CCD reading part 4a has been formed, the protective plate 9 comprising a thin plate of glass, etc. is adhered, and the space formed by the auxiliary substrate 10 and the protective plate 9 is filled with resin 11 comprised of an epoxy resin, etc. (FIG. 7B).

Figure 7C:
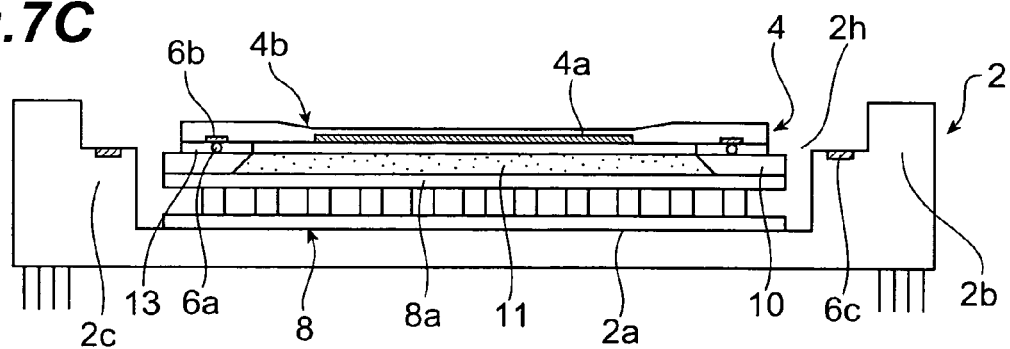
Figure 7D:
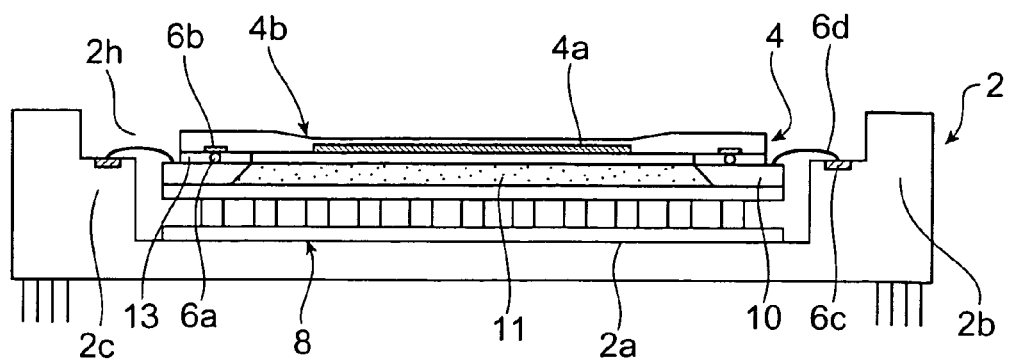

Furthermore, the auxiliary substrate 10 and the resin 11 are adhered, by means of an epoxy resin containing an Ag filler, etc., onto the cooling surface 8a of the Peltier element 8, which has been mounted to the bottom surface part 2a of the package 2 (FIG. 7C). The semiconductor substrate 4 is thereby housed inside the cavity 2h. The auxiliary substrate 10 and the package-side electrodes 6c, disposed on the steps 2c of the side wall parts 2b, are then electrically connected by the bonding wires 6d comprised of Au (FIG. 7D).

Figure 8A:
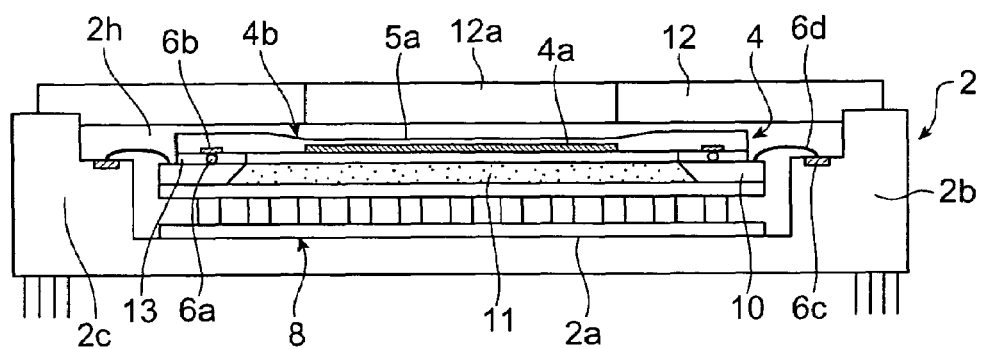
FIGS. 8A and 8B are process diagrams for explaining the method of manufacturing the image pickup device according to the second embodiment (part 3)
Figure 8B:
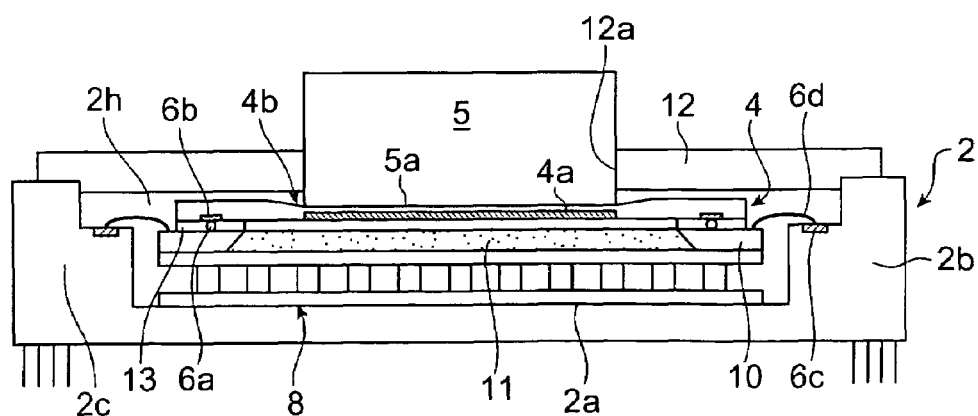

When the guide member 12, which serves as a reference member for inserting the FOP 5 into the cavity 2h, has been fitted onto the package 2, a room temperature curing type adhesive, which is comprised of a silicone resin, etc. and has a property of being transparent to the light from the scintillator, is coated onto the thin part 4b of the semiconductor substrate 4 (FIG. 8A). A part of the FOP 5 is then inserted into the cavity 2h from the guiding opening 12a of the guide member 12, and the light outgoing end surface 5a of the FOP 5 is optically coupled to the thin part 4b (FIG. 8B). By the gap between the FOP 5 and the guiding opening 12a then being sealed by a resin, the image pickup device 20 of the second embodiment is obtained.

As described above, in accordance with the method of manufacturing image pickup device 20 according to the second embodiment, since in the step (FIG. 8B) of joining the FOP 5 to the semiconductor substrate 4, the light outgoing end surface 5a of the FOP 5 and the CCD reading part 4a do not contact each other directly, excess current will not flow from the FOP 5 to the CCD reading part 4a even when the FOP 5 is charged. Electrostatic discharge of the CCD reading part 4a is thus restrained and the manufacturing yield of this image pickup device is improved.

Third Embodiment

The arrangement of a third embodiment of an image pickup device according to the present invention shall now be described using FIG. 9.

The image pickup device 30 according to this third embodiment differs from the first embodiment in the shape of the package 2. The package 2 of this third embodiment has openings at two opposing surfaces. In the following, the opening portion formed on a bottom surface of the package 2 shall be referred to as "bottom surface opening 2g," and the opening portion formed on an upper end surface of the package 2 shall be referred to as "top plate opening 2f." With this third embodiment, the bottom surface opening 2g is covered by a bottom cover 2d, and a semiconductor substrate 4 is connected to this bottom cover 2d. That a protective plate 9 is put in contact with a front surface of the semiconductor substrate 4, at which a CCD reading part 4*a* is formed, is also a point of difference with respect to the first embodiment.

The principal parts of the image-pickup device 30 according to this third embodiment also correspond to the electron beam image pickup device 200 shown in FIG. 1 and can be applied to the transmission electron microscope of FIG. 1, etc.

In the image pickup device 30, the package 2 has the openings 2*f* and 2*g* at two surfaces that oppose each other. Put in another way, the package 2 is arranged from a top plate 2*e* and side wall parts 2*b*, and the bottom surface does not have a bottom but has the bottom surface opening 2*g* formed therein. Also, on the upper end surface of the package 2, the top plate 2*e*, having the top plate opening 2*f* formed in a central part thereof, is disposed.

The bottom surface opening 2*g* of the package 2 is covered by a bottom cover 2*d*, and the semiconductor substrate 4, on the front surface side of which the CCD reading part 4*a* is formed, is housed inside the cavity of the package 2 by being fixed to the bottom cover 2*d*. Also, at least a part of the FOP 5 is inserted into the interior of the package 2 from the top plate opening 2*f* and joined to the semiconductor substrate 4. The image pickup device 30 further comprises electrical wirings 6 for taking out charge signals output from the CCD reading part 4*a* to the exterior of the package 2.

In the semiconductor substrate 4, a portion of a back surface that corresponds to the front surface region at which the CCD reading part 4*a* is formed is thinned (thin part 4*b*). The CCD reading part 4*a* is fixed to the bottom cover 2*d* via a protective plate 9 so as to face the bottom cover 2*d*, and a spacer 14, having an opening that surrounds the periphery of the top plate opening 2*f*, is positioned between the semiconductor substrate 4 and the top plate 2*e*.

A guide member 7, having a guiding opening 7*a*, is mounted to the top plate opening 2*f* of the package 2, and at least a part of the FOP 5 is inserted into the package 2 from this guiding opening 7*a* and a light outgoing end surface 5*a* thereof is optically coupled to the thin part 4*b*.

The electrical wirings 6 include substrate-side electrodes 6*b* disposed on the front surface of the semiconductor substrate 4, and package-side electrodes 6*c* disposed on the steps 2*c* of the side wall parts 2*b*, and these substrate-side electrodes 6*b* and package-side electrodes 6*c* are electrically connected via bonding wires 6*d*.

As described above, the image pickup device 30 according to this third embodiment has a structure such that the FOP 5 and the CCD reading part 4*a* do not contact each other directly. Thus, even when excess current flows from the FOP 5 to the semiconductor substrate 4 in the process of joining the FOP 5 to the semiconductor substrate 4, electrostatic discharge of the CCD reading part 4*a* is restrained.

Also, since the thickness of the thin part 4*b*, to which the FOP 5 is joined, is only approximately 10 μm to 30 μm, the CCD reading part 4*a* can detect even light of short wavelength emitted from the light outgoing end surface 5*a*. By forming the thin part 4*a* such that the light outgoing end surface 5*a* of the FOP 5 can be fitted in a gap-less manner, positioning in the process of joining the FOP 5 to the semiconductor substrate 4 is facilitated.

Since the protective plate 9, comprised of glass, etc., is put in contact with the front surface of the semiconductor substrate 4, at which the CCD reading part 4*a* is formed, the CCD reading part 4*a* is protected from contamination, etc., and the semiconductor substrate is reinforced mechanically.

Also, since the electrical wirings 6 for taking out charge signals of the CCD reading part 4*a* to the exterior are shortened, the electrical wirings 6 are made small in wiring capacity and the waveforms of signals from the CCD reading part 4*a* will not become attenuated.

Since the spacer 14 is positioned between the back surface of the semiconductor substrate 4 and the top plate 2*e* of the package 2, the interval between the two is kept constant.

A method of manufacturing image pickup device 30 according to the third embodiment shall now be described using FIGS. 10A to 10D, 11A to 11D and 12.

Figure 10A:
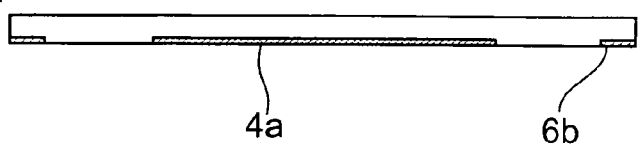
FIGS. 10A to 10D are process diagrams for explaining a method of manufacturing the image pickup device according to the third embodiment (part 1)
Figure 10B:
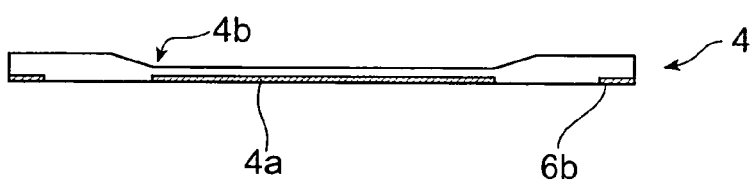
Figure 10C:
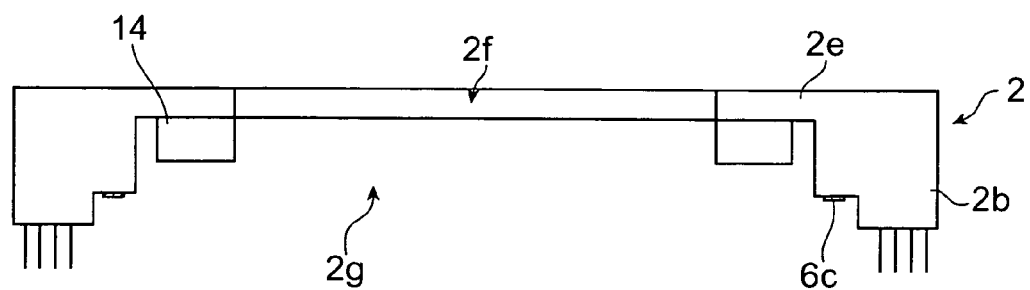

First, in the semiconductor substrate 4, at which the CCD reading part 4*a* has been formed at the front surface side (FIG. 10A), the thin part 4*b* is formed at the portion of the back surface corresponding to the front surface region at which the CCD reading part 4*a* has been formed (FIG. 10B). The ceramic spacer 14, for fixing the semiconductor substrate 4, is then adhered onto the top plate 2*e* of the package 2 by an epoxy resin containing Ag filler, etc. (FIG. 10C).

Figure 10D:
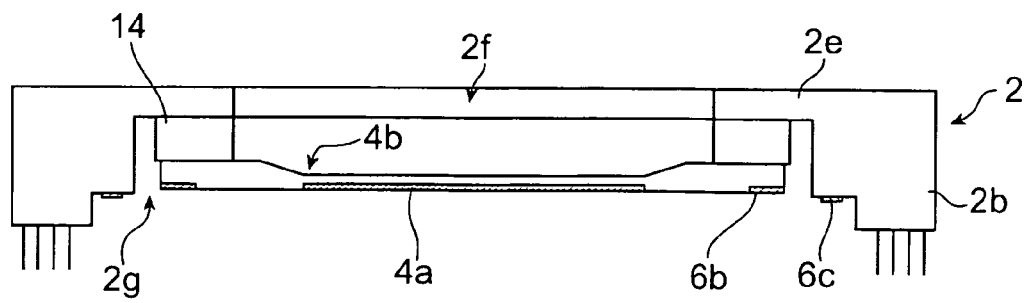
Figure 11A:
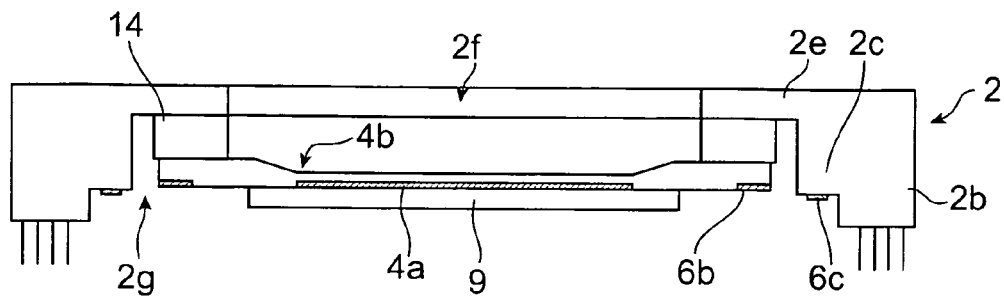
FIGS. 11A to 11D are process diagrams for explaining the method of manufacturing the image pickup device according to the third embodiment (part 2)

The semiconductor substrate 4 is adhered, with the CCD reading part 4*a* faced downwards, onto the spacer 14 by an epoxy resin containing Ag filler, etc. (FIG. 10D). Thereafter, the protective plate 9, which is a thin plate of glass, etc., is adhered by an epoxy resin, etc., onto the front surface of the semiconductor substrate 4 so as to cover the region at which the CCD reading part 4*a* has been formed (FIG. 11A).

Figure 11B:
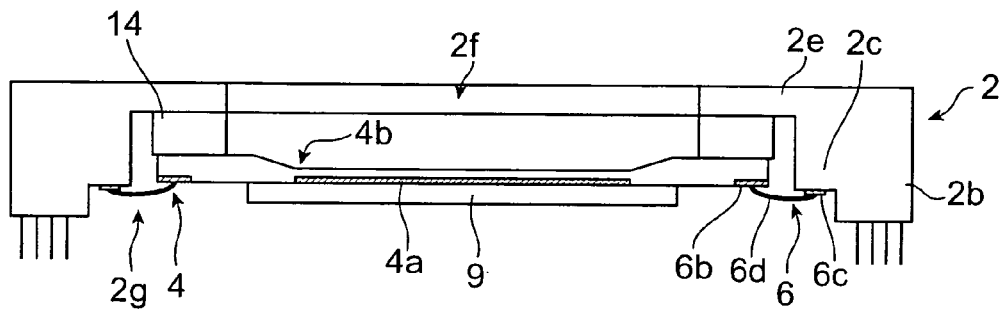

The substrate-side electrodes 6*b*, disposed on the front surface (surface at which the CCD reading part 4*a* is formed) of the semiconductor substrate 4, and the package-side electrodes 6*c*, disposed on the steps 2*c* of the side wall parts 2*b*, are then electrically connected via the bonding wires 6*d* (FIG. 11B).

Figure 11C:
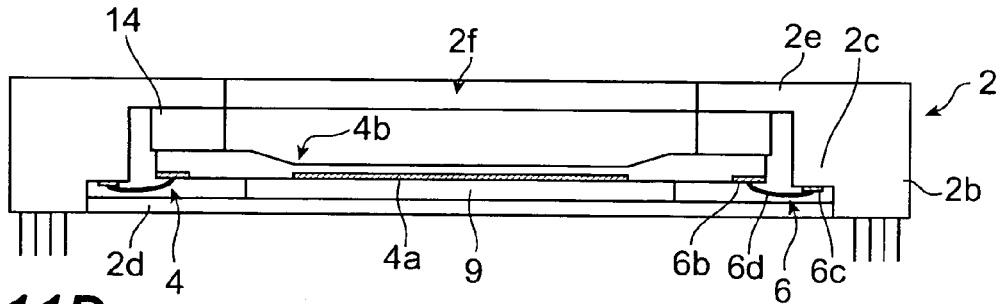

The bottom cover 2*d*, comprised of ceramic, is adhered onto the package 2 and the protective plate 9 by means of a room temperature curing type adhesive agent, which is comprised of a silicone resin, etc. (FIG. 11C). The bottom cover 2*d* and the protective plate 9 are thereby put in a state enabling conduction of heat and it becomes possible to cool the CCD reading part 4*a* via the bottom cover 2*d*.

Figure 11D:
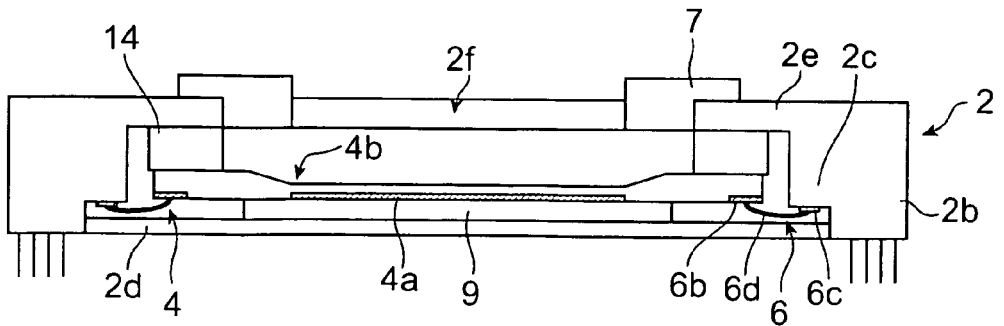
Figure 12:
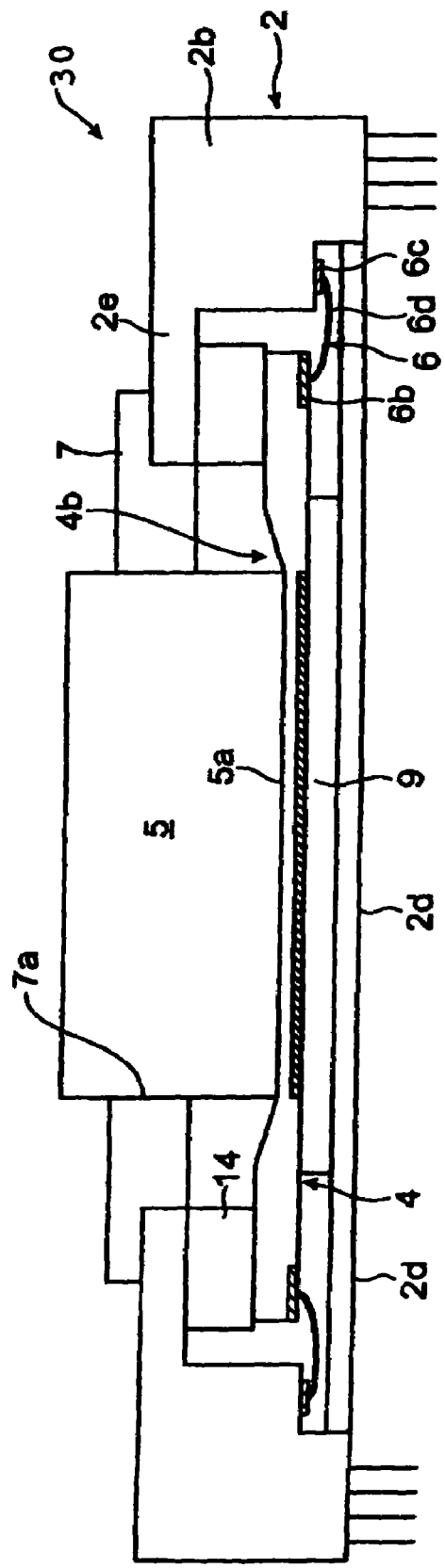
FIG. 12 is a process diagrams for explaining the method of manufacturing the image pickup device according to the third embodiment (part 3).

A room temperature curing type adhesive agent, which is comprised of a silicone resin, etc., is coated onto the thin part 4*b*, and the guide member 7, which functions as a positioning member in the process of inserting a part of the FOP 5 into the package 2, is mounted to the opening 2*f* provided in the top plate 2*e* (FIG. 11D). The FOP 5 is then inserted into the package 2 from the guiding opening 7*a* of the guide member 7, and the light outgoing end surface 5*a* of the FOP 5 is optically coupled to the thin part 4*b* (FIG. 12). Thereafter, the gap between the FOP 5 and the guiding opening 7*a* is sealed by a resin, and the image pickup device 30 of the third embodiment is thus obtained.

As described above, in accordance with the method of manufacturing image pickup device 30 according to the third embodiment, since in the step (FIG. 12) of joining the FOP 5 to the semiconductor substrate 4, the light outgoing end surface 5*a* of the FOP 5 and the CCD reading part 4*a* do not contact each other directly, excess current will not flow from the FOP 5 to the CCD reading part 4*a* even when the FOP 5 is charged. Electrostatic discharge of the CCD reading part 4*a* is thus restrained and the manufacturing yield of this image pickup device is improved.

From the above description of the present invention, it is clear that this invention can be modified in various ways. Such modifications cannot be admitted as falling outside the spirit and scope of this invention, and modifications that are obvious to all those skilled in the art are included within the scope of the Claims that follow.

INDUSTRIAL APPLICABILITY

As described above, in accordance with this invention, the image pickup device, having a structure with which a CCD reading part is unlikely to undergo electrostatic discharge in the process of joining an FOP to the CCD reading part, and a method of manufacturing such an image pickup device are provided. Also, since the thickness of a semiconductor substrate of a thin part, to which the FOP is joined, is only approximately 10 μm to 30 μm, the CCD reading part can detect even light of short wavelength that is emitted from a light outgoing end surface. By forming the thin part of the semiconductor substrate so that the light outgoing end surface of the FOP can be fitted on without looseness, positioning in the process of joining the FOP to the semiconductor substrate is facilitated.

The invention claimed is:

1. An image pickup device comprising:
a semiconductor substrate having a back surface, serving as a light-incident surface, and a front surface, opposing the back surface and being provided with a charge reading part constituted by a charge coupled device that detects light propagating from the back surface, said semiconductor substrate having a structure such that the thickness of the region at which said charge reading part is disposed is made thinner than the thickness of the remaining region;
a package having a cavity that houses said semiconductor substrate and that is fixed with said semiconductor substrate while the front surface of said semiconductor substrate faces a bottom part of said cavity;
a fiber optic plate having a light outgoing end surface joined to the back surface of said semiconductor substrate while at least a part thereof is housed in said cavity of said package;
a cover covering an upper opening of said cavity of said package, said cover having a guiding opening for inserting at least the part of said fiber optic plate into said cavity; and
electrical wirings for taking out charge signals output from said charge reading part to the exterior of said package, said electrical wirings including substrate-side electrodes disposed on the front surface of said semiconductor substrate, package-side wirings disposed on the bottom surface of said cavity and being electrically connected to said substrate-side electrodes via bumps disposed on said substrate-side electrodes, and package-side electrodes disposed on an inner wall of said cavity and being electrically connected to said package-side wirings by bonding wires.

2. An image pickup device comprising:
a semiconductor substrate having a back surface, serving as a light-incident surface, and a front surface, opposing the back surface and being provided with a charge reading part constituted by a charge coupled device that detects light propagating from the back surface, said semiconductor substrate having a structure such that the thickness of the region at which said charge reading part is disposed is made thinner than the thickness of the remaining region;
a package having a cavity that houses said semiconductor substrate and having one surface whose opening portion is covered by a bottom cover, and the other surface opposing said one surface and whose opening portion is attached with a guide member having a guiding opening, said package being fixed with said semiconductor substrate such that said charge reading part and said bottom cover face each other while said semiconductor substrate is housed;
a fiber optic plate having at least a part housed in said cavity of said package via the guiding opening of said guide member, said fiber optic plate having a light outgoing end surface thereof being joined to the region of the back surface of said semiconductor substrate that is thin in thickness; and
electrical wirings for taking out charge signals output from said charge reading part to the exterior of said package, said electrical wirings including substrate-side electrodes disposed on the front surface of said semiconductor substrate, and package-side electrodes disposed on an inner wall of said package and being electrically connected to said substrate-side electrodes by bonding wires.

* * * * *